(12) United States Patent
Kuncham et al.

(10) Patent No.: US 12,294,398 B2
(45) Date of Patent: May 6, 2025

(54) ESTIMATING AND CORRECTING TRANSMITTER LOCAL OSCILLATOR LEAKAGE IN LOOPBACK PATH

(71) Applicant: TEXAS INSTRUMENTS INCORPORATED, Dallas, TX (US)

(72) Inventors: Sucheth Sureshbabu Kuncham, Bangalore (IN); Prakhar Agrawal, Bangalore (IN); Rohit Chatterjee, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 195 days.

(21) Appl. No.: 18/308,556

(22) Filed: Apr. 27, 2023

(65) Prior Publication Data

US 2023/0421189 A1 Dec. 28, 2023

(30) Foreign Application Priority Data

Jun. 27, 2022 (IN) .............................. 202241036648

(51) Int. Cl.
*H04B 1/10* (2006.01)
*H03D 7/12* (2006.01)
*H04L 27/38* (2006.01)

(52) U.S. Cl.
CPC ............... *H04B 1/109* (2013.01); *H03D 7/12* (2013.01); *H04L 27/38* (2013.01)

(58) Field of Classification Search
CPC ........... H04B 1/109; H03D 7/12; H04L 27/38
USPC ........................................................ 375/320
See application file for complete search history.

(56) References Cited

U.S. PATENT DOCUMENTS

| | | | |
|---|---|---|---|
| 11,695,442 B2 * | 7/2023 | Kuncham ................ | H04B 1/30 455/323 |
| 2014/0269863 A1 * | 9/2014 | Fan ........................ | H04B 1/525 375/221 |

* cited by examiner

*Primary Examiner* — Kevin M Burd
(74) *Attorney, Agent, or Firm* — Brian D. Graham; Frank D. Cimino

(57) ABSTRACT

In an example, a system includes a receiver configured to receive a differential input signal from a quadrature amplitude modulation (QAM) transmitter at a differential interface that includes a first input and a second input. The system also includes a first switch coupled to the first input and a second switch coupled to the second input, where the first switch and second switch are configured to couple the first input and the second input to a complex mixer in a non-inverting configuration. The system includes a third switch coupled to the first input and a fourth switch coupled to the second input, where the third switch and the fourth switch are configured to couple the first input and the second input to the complex mixer in an inverting configuration. The complex mixer is configured to produce an output signal based on the non-inverting configuration and the inverting configuration.

20 Claims, 5 Drawing Sheets

ESTIMATING AND CORRECTING TRANSMITTER LOCAL OSCILLATOR LEAKAGE IN LOOPBACK PATH

CROSS-REFERENCE TO RELATED APPLICATIONS

The present application claims priority to India Provisional Patent Application No. 202241036648, which was filed Jun. 27, 2022, is titled "A NOVEL METHOD OF ESTIMATING/CORRECTING TRANSMITTER LO LEAKAGE BY FLIPPING THE DIFFERENTIAL NATURE," and is hereby incorporated herein by reference in its entirety.

BACKGROUND

Radio architectures may use a carrier signal produced by a local oscillator (LO) to transmit an information-bearing input signal. The carrier signal may have a much higher frequency than the input signal. The carrier signal may leak into the final transmitted signal, which is referred to as LO leakage. LO leakage may result in efficiency loss. Wireless standards have specifications for the maximum tolerable amount of LO leakage. A correction signal may be added to the transmitted signal to cancel out the LO leakage.

SUMMARY

In accordance with at least one example of the description, a system includes a receiver configured to receive a differential input signal from a quadrature amplitude modulation (QAM) transmitter at a differential interface that includes a first input and a second input. The system also includes a first switch coupled to the first input and a second switch coupled to the second input, where the first switch and second switch are configured to couple the first input and the second input to a complex mixer in a non-inverting configuration. The system includes a third switch coupled to the first input and a fourth switch coupled to the second input, where the third switch and the fourth switch are configured to couple the first input and the second input to the complex mixer in an inverting configuration. The complex mixer is configured to produce an output signal based on the non-inverting configuration and the inverting configuration.

In accordance with at least one example of the description, a method includes receiving a differential QAM input signal from a transmitter. The method also includes enabling a first switch and a second switch to provide the differential QAM input signal to a complex mixer in a non-inverting configuration. The method includes enabling a third switch and a fourth switch to provide the differential QAM input signal to the complex mixer in an inverting configuration. The method also includes mixing the differential QAM input signal with the complex mixer to produce an output signal. The method includes determining, with a controller, local oscillator leakage associated with the transmitter based at least in part on the output signal. The method includes correcting the local oscillator leakage.

In accordance with at least one example of the description, a system includes a transmitter configured to transmit QAM signals. The system also includes a receiver configured to receive a differential QAM input signal from the transmitter at a differential interface that includes a first input and a second input. The system includes a first switch coupled to the first input and a second switch coupled to the second input, where the first switch and second switch are configured to couple the first input and the second input to a complex mixer in a non-inverting configuration to produce a non-inverting signal provided to the complex mixer. The system also includes a third switch coupled to the first input and a fourth switch coupled to the second input, where the third switch and the fourth switch are configured to couple the first input and the second input to the complex mixer in an inverting configuration to produce an inverting signal input to the complex mixer. The system includes a controller configured to correct a transmitter local oscillator leakage with the inverting signal and the non-inverting signal.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
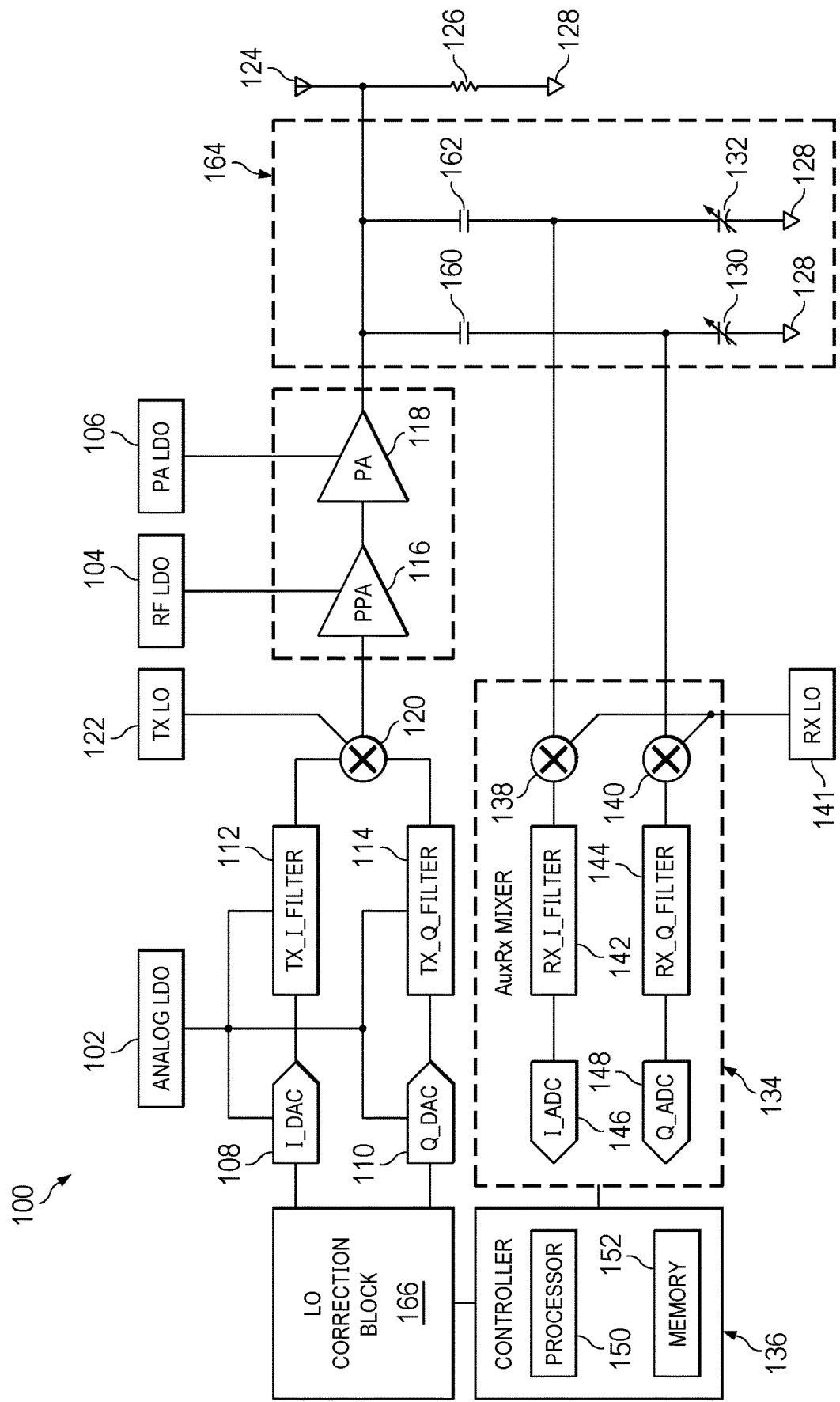
FIG. 1 is a block diagram of a transmitter and auxiliary receiver in accordance with various examples.

Quadrature amplitude modulation (QAM) is a modulation method for transmitting information. QAM conveys two message signals by modulating the amplitude of two carrier waves. The two carrier waves have the same frequency but are out of phase with one another by 90°, which is called orthogonality or quadrature. One of the waves is referred to as the in-phase (I) signal (I chain), and the other is referred to as the quadrature (Q) signal (Q chain). The transmitted signal is created by adding the two carrier waves together. At a receiver, the two waves may be separated (e.g., demodulated) because of their orthogonality. The modulated signals are often low-frequency and low-bandwidth waveforms compared to the carrier frequency.

LO leakage occurs if the carrier signal leaks into the final transmission. The LO leakage should be below a certain level to meet various standards, such as IEEE 802.11 (Wi-Fi) standards. To meet the standards, the carrier signal should not be present at the final output of the transmitter. Some systems have a power detector at the transmitter output that measures various LO leakage values and then performs calculations to iteratively find a correction value to remove the LO leakage. However, these iterative processes take time and consume a large amount of power, which makes it difficult to meet LO leakage standards.

In examples herein, a loopback path (or feedback path) is implemented to measure and then correct LO leakage. An auxiliary receiver in the loopback path receives the transmitted QAM signals and uses these signals to estimate LO leakage, which appears as a constant value. The auxiliary receiver may also have its own leakage that appears as a constant value. The two constant values (of the transmitter and auxiliary receiver) are decoupled to find the LO leakage of the transmitter. The examples herein also account for other transmitter impairments, such as IQ mismatch (IQMM), phase noise, radio frequency (RF) non-linearities, etc. IQMM is caused by non-ideal characteristics of the I path and the Q path.

In the loopback path described herein, hardware switches compensate for the impairments in the auxiliary receiver path. The loopback path includes a complex mixer with differential inputs. Hardware switches coupled to the differential inputs have two configurations. In the first configuration, the transmitted signal, plus a signal added by the auxiliary path (e.g., leakage), are provided to the complex mixer in a non-inverting configuration. In the second configuration, the switches are switched, and the transmitted signal, minus the signal added by the auxiliary path, are provided to the complex mixer in an inverting configuration (e.g., the inverted signal is 180° out of phase from the non-inverted signal). A controller analyzes the outputs of the complex mixer for both the non-inverting and the inverting configuration, and then removes the constant leakage signal added by the auxiliary path. The controller then performs other calculations described herein to estimate and correct for the transmitter LO leakage. This process is performed by the controller for both the I chain and the Q chain. In the examples herein, the time for performing this process is small compared to other systems. The raw IQMM or LO leakage of the loopback path may be high as long as it is the same for both configurations (non-inverting and inverting), because the IQMM and LO leakage will be removed by switching the non-inverting/inverting configuration of the inputs to the complex mixer. This feature relaxes the analog design requirements for the system. Also, the solution is applicable for all QAM-based architectures.

FIG. 1 is a block diagram of a transmitter and auxiliary receiver in accordance with various examples herein. System 100 includes some components of a transmitter and auxiliary receiver, but other systems may include components or circuitry that is not shown here for simplicity. System 100 includes low-dropout (LDO) voltage regulators 102, 104, and 106. Analog LDO 102 provides a supply voltage to transmit analog components 108, 110, 112, and 114, which are described below. RF LDO 104 provides a supply voltage to pre-power amplifier (PPA) 116. PA LDO 106 provides a supply voltage to power amplifier (PA) 118.

The transmitter portion of system 100 includes digital-to-analog converter (DAC) 108 (I_DAC) for the I chain and DAC 110 (Q_DAC) for the Q chain. DAC 108 is coupled to I chain filter 112 (TX_I_FILTER), and DAC 110 is coupled to Q chain filter 114 (TX_Q_FILTER). I chain filter 112 and Q chain filter 114 are coupled to TX mixer 120. TX mixer 120 is also coupled to TX local oscillator (TX LO) 122. An output of TX mixer 120 is coupled to PPA 116. An output of PPA 116 is coupled to PA 118. An output of PA 118 is coupled to antenna 124. Antenna 124 is represented with a load 126 coupled to ground 128. Antenna 124 may also be coupled to variable capacitors 130 and 132, which are each coupled to ground 128. Antenna 124 may also be coupled to capacitors 160 and 162 in one example. Capacitors 130, 132, 160, and 162 form an attenuator network 164 (e.g., capacitor attenuator 164) for auxiliary receiver 134. Capacitors 130, 132, 160, and 162 attenuate the power of the output of PA 118 before the output is provided to the complex mixers in auxiliary receiver 134. In another example, other circuitry may attenuate the output of PA 118.

The components of system 100 described above are part of the transmitter path for system 100. The loopback path in this example includes the transmitter path and the auxiliary receiver 134. Auxiliary receiver 134 may include many other components not shown in FIG. 1, such as LOs, LDOs, and other circuitry. Auxiliary receiver 134 may be coupled to a controller 136 configured to perform the operations described herein. Auxiliary receiver 134 includes complex mixers 138 and 140. Complex mixer 138 is a complex mixer for the I chain, and complex mixer 140 is a complex mixer for the Q chain. Complex mixer 138 is coupled to I chain filter (RX_I_FILTER) 142, and complex mixer 140 is coupled to Q chain filter (RX_Q_FILTER) 144. A receive local oscillator (RX LO) 141 provides an LO signal to complex mixers 138 and 140 for mixing the signals. The RX LO 141 signal may be the same LO signal as the LO signal from TX LO 122 in one example. I chain filter 142 is coupled to I chain analog-to-digital converter (ADC) 146 (I_ADC). Q chain filter 144 is coupled to Q chain ADC 148 (Q_ADC).

In an example operation, a signal is transmitted in system 100 via the I chain and the Q chain. The message signal on the I chain passes through DAC 108, where the digital signal is converted to an analog signal. The analog signal on the I chain is received by I chain filter 112 and filtering is performed. Likewise, the message signal on the Q chain passes through DAC 110, where the digital signal is converted to an analog signal. The analog signal on the Q chain is received by Q chain filter 114. Both message signals (the I chain and the Q chain) are sent to TX mixer 120. The signals are mixed with a carrier signal from TX LO 122 by TX mixer 120. As described above, the I and Q message signals are out of phase with another by 90° in the signal provided by the TX mixer 120. The TX mixer 120 output signal that includes the I and Q message signals is then received by PPA 116 and PA 118, where the mixer 120 output signal is amplified before being transmitted via antenna 124.

Auxiliary receiver 134 receives a copy of the transmitted signal and uses the message signals therein in a loopback path to compensate for the LO leakage as described herein. The transmitter LO leakage and other impairments of both the transmitter and the auxiliary receiver 134 are estimated and corrected with the techniques herein. Auxiliary receiver 134 includes two complex mixers 138 and 140. One complex mixer 138 receives and mixes the I chain, and the other complex mixer 140 receives and mixes the Q chain. Complex mixer 138 provides the I chain signal to I chain filter 142, and then the filtered I chain signal is provided to I chain ADC 146. I chain ADC 146 provides the I chain signal to controller 136. Complex mixer 140 provides the Q chain signal to Q chain filter 144, and then the filtered Q chain signal is provided to Q chain ADC 148. Q chain ADC 148 provides the Q chain signal to controller 136.

As described below, complex mixers 138 and 140 each produce a non-inverted signal and an inverted signal. Therefore, four signals are provided to controller 136 (non-inverted and inverted signals for both the I chain and the Q chain). With these four signals, four equations may be created and solved by controller 136 to compensate for the transmitter LO leakage. Using the compensation, the constant leakage in auxiliary receiver 134 may also be removed. The controller 136 may produce a correction signal that is provided to the transmitter to correct for the LO leakage and other impairments. The correction signal may be supplied at an LO correction block 166, which provides the LO correction signal to the inputs of DACs 108 and 110. LO correction block 166 may include any suitable hardware to receive a correction signal and provide the correction signal to the transmit chain. In other examples, the LO correction signal may be provided to other components in the transmit chain.

Figure 3:
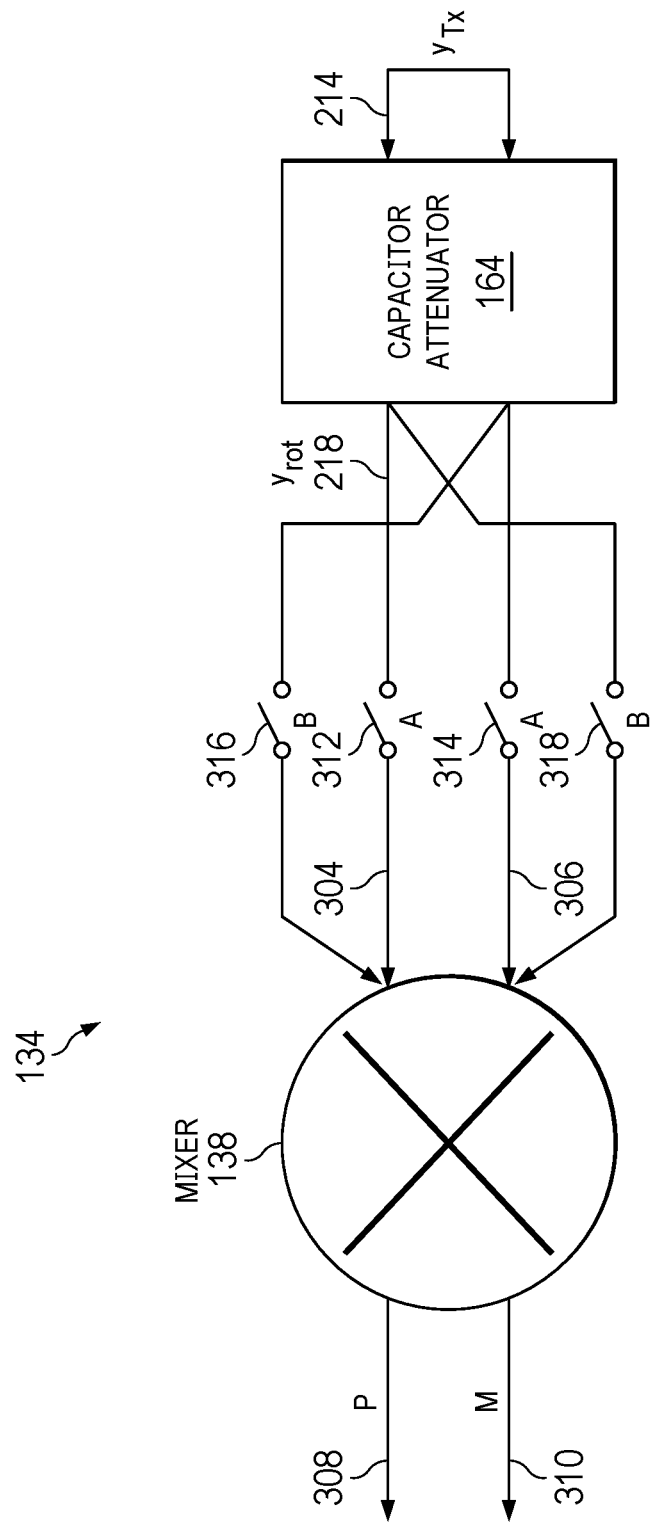
FIG. 3 is a diagram of an auxiliary receiver in accordance with various examples.
Figure 4:
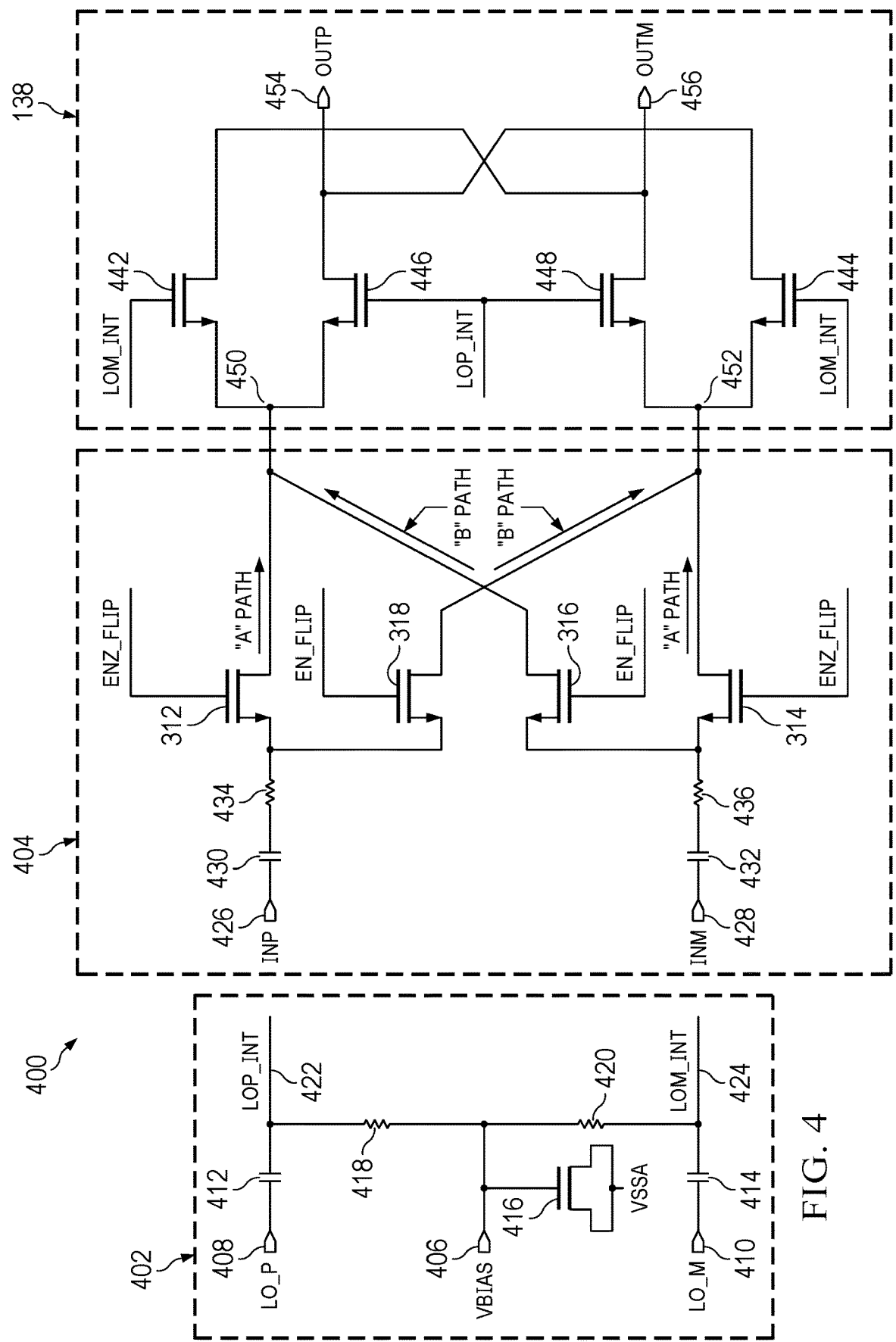
FIG. 4 is a circuit diagram of a switch network and a complex mixer in accordance with various examples.

Hardware switches for creating the non-inverting and inverting signals may be included within complex mixers 138 and 140. FIGS. 3-4, described below, provide one example configuration of the hardware switches within complex mixers 138 and 140.

Controller 136 may include a processor 150 and memory 152 in one example. The memory 152 may include any suitable data, code, logic, or instructions. The processor 150 is configured to read and execute computer-readable instructions. For example, the processor 150 is configured to invoke and execute instructions in a program stored in the memory 152, including instructions. Instructions may perform the actions described herein, such as estimating and providing a correction for LO leakage and other impairments.

In an example, the memory 152 may be integrated with the processor 150. The memory 152 is configured to store various software programs and/or multiple groups of instructions. In some examples, the memory 152 is configured to store the instructions for implementing some or all of the various methods and processes provided in accordance with the various examples of this description.

In another example, elements of controller 136 disclosed herein may use any combination of dedicated hardware and instructions stored in a non-transitory medium, such as the memory 152. The non-transitory medium includes all electronic mediums or media of storage, except signals. The processor 150 may include one or more microcontrollers, application-specific integrated circuits (ASICs), central processing units (CPUs), graphics processing units (GPUs), and/or other processing resources configured to execute instructions stored on the medium. Examples of suitable non-transitory computer-readable media include one or more flash memory devices, battery-backed random access memory (RAM), solid state drives (SSDs), hard disk drives (HDDs), optical media, and/or other memory devices suitable for storing the instructions for the processor 150.

Figure 2:
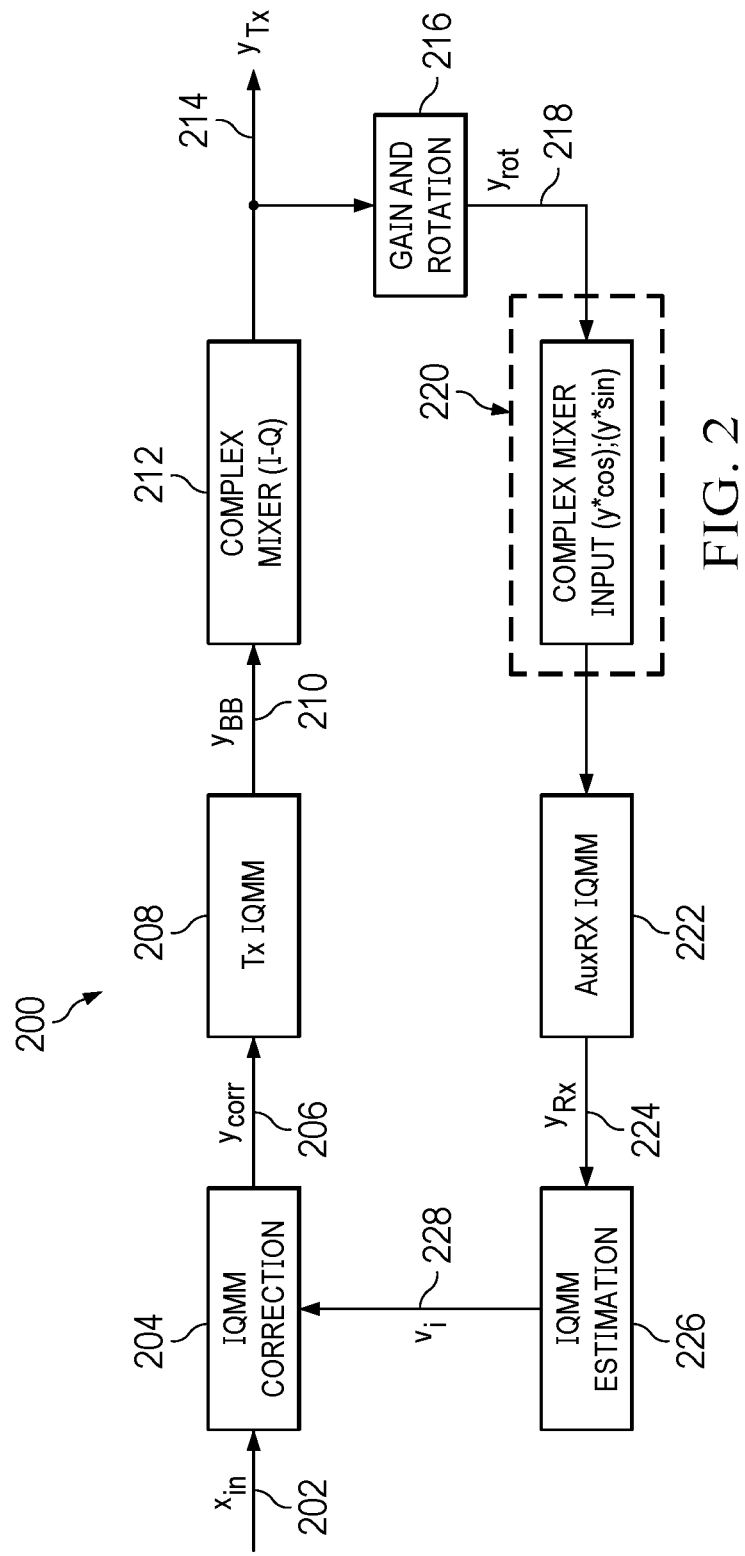
FIG. 2 is a block diagram of a transmit/auxiliary receiver (TX/AuxRX) chain in accordance with various examples.

FIG. 2 is a block diagram of a transmit/auxiliary receiver (TX/AuxRX) chain in accordance with various examples herein. Some components in system 200 represent functions, and may be embodied in hardware, software, or may be performed by any suitable component, such as controller 136.

In one example operation, a signal $x_{in}$ 202 to be transmitted receives IQ correction at IQMM correction 204 (from the loopback loop, described below). IQMM correction 204 produces a corrected output signal $y_{corr}$ 206. TX IQMM 208 represents the transmit IQMM, which is corrected by $y_{corr}$ 206 from the loopback path. A signal $y_{BB}$ 210 (e.g., a baseband signal) is provided to a complex mixer 212. The complex mixer 212 mixes the I and Q chain signals, and transmits the signals, where the transmitted signal is $y_{Tx}$ 214.

The other components in system 200 provide the loopback path for LO leakage estimation and correction. The transmitted signal $y_{Tx}$ 214 is provided to the auxiliary receiver 134 for correction. The transmitted signal $y_{Tx}$ 214 undergoes gain and rotation 216 as the signal passes through the auxiliary receiver 134 loop. The signal that results after gain and rotation is designated by $y_{rot}$ 218. $y_{rot}$ 218 is provided to complex mixer 220. The operation of complex mixer 220 is described below. Complex mixer 220 includes the hardware switches that produce a non-inverted signal and an inverted signal for each of the I and Q chains. After the non-inverted signals and the inverted signals are produced by complex mixer 220, AuxRx IQMM 222 is applied to the signals to produce a $y_{RX}$ 224 signal. $y_{RX}$ 224 is provided to IQMM estimation 226, where a controller or processor performs an IQMM estimation so the IQMM may be corrected. The process for performing IQMM estimation and correction is described below. After IQMM estimation is performed, a signal $v_i$ 228 is provided to IQMM correction 204 to correct LO leakage and other impairments in the transmitted signal.

In examples described herein, switches in complex mixer 220 are activated to create the non-inverting and inverting signals to properly determine the constant leakage values. Complex mixer 220 has differential inputs. The switches in complex mixer 220 invert the connections at the input of complex mixer 220 to negate the transmit local oscillator leakage (TX LOL) as described below.

FIG. 3 is a diagram of selected components of auxiliary receiver 134 in accordance with various examples herein. Auxiliary receiver 134 may include other circuitry not shown in FIG. 3. In this example, a capacitor attenuator 164, hardware switches, and complex mixer 138 of auxiliary receiver 134 are shown.

In operation, auxiliary receiver 134 resides in the loopback path and receives the transmitted signal, shown here as $y_{Tx}$ 214. $y_{rot}$ 218 is the transmitted signal $y_{Tx}$ 214 that has undergone some gain and rotation in the loopback path. The signal $y_{Tx}$ 214 is received by capacitor attenuator 164, which attenuates the signal and produces $y_{rot}$ 218. Capacitor attenuator 164 provides the attenuated signal $y_{rot}$ 218 to inputs 304 and 306 of complex mixer 138 via the switches 312, 314, 316, and 318. Complex mixer 138 produces a differential output signal at output 308 (plus output P) and output 310 (minus output M).

Switches 312, 314, 316, and 318 provide complex mixer 138 with either a non-inverted signal or an inverted signal. In a first phase of operation, the switches in the "A" path (switches 312 and 314) are closed, and the switches in the "B" path (switches 316 and 318) are open. In this phase, the signal from capacitor attenuator 164 is provided to complex mixer 138 via the "A" path in a non-inverting configuration.

In the second phase of operation, the switches are switched. In the second phase, the switches in the "A" path (switches 312 and 314) are open, and the switches in the "B" path (switches 316 and 318) are closed. In this phase, the signal from capacitor attenuator 164 is provided to complex mixer 138 via the "B" path in an inverting configuration. In one example, a controller or processor provides signals to switches 312, 314, 316, and 318 to open or close the switches at the appropriate time.

After both phases are complete, two readings are collected from the output of complex mixer 138. The first "A" path produces a signal X at the output of the complex mixer 138, and a signal Y is added to X by the auxiliary receiver 134 path. The second "B" path produces a signal minus X at the output of the complex mixer 138, and a signal Y is added to X from the auxiliary receiver 134 path. A controller or processor can then solve for the signal X using equations that represent these two readings from the output of complex mixer 138. One example estimation and correction process is described below.

Complex mixer 140 for the Q chain may be implemented similar to complex mixer 138 and may include a set of differential inputs coupled to a set switches similar to switches 312-318 that are similarly coupled to the capacitor attenuator 164 to receive the signal $y_{rot}$ 218.

FIG. 4 is a circuit diagram of the switches and complex mixer in accordance with various examples herein. System 400 may be located within auxiliary receiver 134 in one example. System 400 includes bias voltage circuitry 402, switch network 404, and complex mixer 138. The voltage VSSA may be a ground voltage in one example. VBIAS is a middle voltage (between the supply voltage and ground) that the input signal swings around.

Bias voltage circuitry 402 includes a terminal 406 that provides VBIAS, and terminals 408 and 410. Terminals 408 and 410 provide LO_P and LO_M, which are the carrier signals, e.g., the switching signal that mixes the higher frequency of the complex mixer 138. Bias voltage circuitry 402 includes capacitors 412 and 414, transistor 416, and resistors 418 and 420. Transistor 416 may be one or more transistors in a transmission gate configuration that provides a control terminal to turn on or off the circuit. Bias voltage circuitry 402 is configured to provide signal LOP_INT at terminal 422 and signal LOM_INT at terminal 424. These signals are voltages used by complex mixer 138 to control the operation of complex mixer 138 by switching the switches in complex mixer 138 on and off.

Switch network 404 includes switches 312, 314, 316, and 318 as described above with respect to FIG. 3. The switches are configured to produce an "A" path and a "B" path to provide the input signal to complex mixer 138. The "A" path is a non-inverting configuration, and the "B" path is an inverting configuration. Switch network 404 also includes input terminals 426 and 428, capacitors 430 and 432, and resistors 434 and 436.

In this example, switches 312, 314, 316, and 318 are embodied in transistors. Other examples may use different circuit components to create switches that provide complex mixer 138 with a non-inverting signal and an inverting signal. Complex mixer 138 includes transistors 442, 444, 446, and 448. Complex mixer 138 also includes input terminals 450 and 452, and output terminals 454 and 456.

In an example operation, switch network 404 receives the differential input signal (such as $y_{rot}$ 218) at input terminals 426 and 428. INP represents the plus input signal, and INM represents the minus input signal. Capacitors 430 and 432 remove the constant portion of the input signal, so only the high frequency components of the signal are coupled from the input to the output. Resistors 434 and 436 are sized to be larger than the resistance of the switches in one example. The "on" resistance of the switches may be less than 5% of the size of resistors 434 and 436 in one example. Therefore, if the "on" resistance of the switches is slightly non-linear, the entire system will not become non-linear.

The switches 312, 314, 316, and 318 allow the switch network 404 to achieve either the non-inverting or the inverting configuration. The switches are controlled by ENZ_FLIP (flip disable) and EN_FLIP (flip enable) signals, which are complementary signals. An ENZ_FLIP signal is provided at a gate or control terminal of the transistors that make up switches 312 and 314. If the ENZ_FLIP signal is high, EN_FLIP is low, and the transistors of switches 312 and 314 are on, and therefore operate as closed switches. The input signal traverses along the "A" path (designated by arrows) to the input terminals 450 and 452 of complex mixer 138. This is the non-inverting configuration. If the ENZ_FLIP signal is high, the EN_FLIP signal is low. A low EN_FLIP signal "opens" switches 316 and 318 by turning off the associated transistors. A controller or processor (not shown in FIG. 4) controls the operation of switches 312, 314, 316, and 318 via the ENZ_FLIP and EN_FLIP signals.

For the inverting configuration, the controller or processor provides a high EN_FLIP signal and a low ENZ_FLIP signal. A high EN_FLIP signal turns on the transistors of switches 316 and 318. A low ENZ_FLIP signal turns off the transistors of switches 312 and 314. In this configuration, the input signal traverses along the "B" path (designated by arrows) to the input terminals 450 and 452 of complex mixer 138.

Complex mixer 138 receives either the non-inverting signal or the inverting signal at input terminals 450 and 452, depending on the configuration of switches 312, 314, 316, and 318. Transistors 442, 444, 446, and 448 are mixer switches that control the operation of complex mixer 138 to produce a differential output signal at output terminals 454 and 456. These transistors switch the complex mixer 138 on or off at the carrier frequency, which mixes the input signal and produces a differential output signal. The differential output signal is represented by output plus (OUTP) and output minus (OUTM). The transistors 442 and 444 are biased at a gate or control terminal with the LOM_INT signal, provided by bias voltage circuitry 402 at terminal 424. The transistors 446 and 448 are biased at a gate or control terminal with the LOP_INT signal, provided by bias voltage circuitry 402 at terminal 422. The LOM_INT and LOP_INT signals switch the transistors 442, 444, 446, and 448 on or off at the carrier frequency to mix the signal and produce the differential output signal. A controller or processor (such as controller 136) receives the differential output signal from output terminals 454 and 456 for both the non-inverting and the inverting configurations, and then provides the estimation and correction for LO leakage and other impairments as described below.

In an example, the "A" and "B" paths and the other circuitry in switch network 404 should not add any distortions to the signal, and both paths should have similar LO leakage. Also, the switches should be sized properly so they are not too large or too small. Switches that are too small may reduce the gain of auxiliary receiver 134 and cause signal distortion. Switches that are too large may have a large switch capacitance when in the off state, which may couple the signal through the non-active path (either the "A" or the "B" path) and cause signal distortion.

Complex mixer 140 for the Q chain may be implemented similar to complex mixer 138, and in an example, the circuitry in system 400 is duplicated, with a first copy associated with complex mixer 138 and a second copy associated with complex mixer 140 in FIG. 1. One complex mixer receives the I chain signal and the other complex mixer receives the Q chain signal. A controller or processor (such as controller 136) receives both the I chain signals (inverted and non-inverted) and the Q chain signals (inverted and non-inverted) and then provides the estimation and correction.

One example process for estimating and correcting the TX LO leakage is described herein. Other processes may be useful in other examples. In this example process, the LO leakage of the signal for the I chain and the Q chain may be represented by Equations (1) and (2):

$$y_{DC\text{-}Tx} = I_{Tx}; Q_{Tx} \tag{1}$$

$$y_{Tx\text{-}DC}(t) = I_{Tx} \cdot a \cdot \cos(\phi) \cdot Re\{e^{j\omega_c t}\} + (Q_{Tx} + I_{Tx} \cdot a \cdot \sin(\phi)) \cdot Im\{e^{j\omega_c t}\} \tag{2}$$

As the signal passes through the auxiliary receiver 134 loop, the signal is subjected to gain (A) and rotation (θ), as shown in Equation (3) for both the I chain and the Q chain:

$$G_{Rx} = A_I \cos(\theta_I); A_Q \cos(\theta_Q) \tag{3}$$

The auxiliary receiver mixer input to the ADCs (e.g., ADC 146 and 148) provides additional gain as shown in Equation (4):

$$G_{Rx} = B_I; B_Q \tag{4}$$

The auxiliary receiver 134 adds its own constant leakage, as shown in Equation (5):

$$y_{DC-Rx} = I_{Rx}; Q_{Rx}$$

In the non-inverted configuration, the constant leakage may be represented by Equation (6) for the I chain and Equation (7) for the Q chain:

$$y_{DC-ADC-I} = I_{Tx}A_I B_I \cos(\theta_I + \phi) + Q_{Tx}A_Q B_Q \sin(\theta_Q) + I_{Rx}B_I \quad (6)$$

$$y_{DC-ADC-Q} = I_{Tx}A_I B_I \sin(\theta_I + \phi) + Q_{Tx}A_Q B_Q \cos(\theta_Q) + Q_{Rx}B_Q \quad (7)$$

In the inverted configuration, the constant leakage may be represented by Equation (8) for the I chain and Equation (9) for the Q chain:

$$y_{DC-ADC-I} = -I_{Tx}A_I B_I \cos(\theta_I + \phi) - Q_{Tx}A_Q B_Q \sin(\theta_Q) + I_{Rx}B_I \quad (8)$$

$$y_{DC-ADC-Q} = -I_{Tx}A_I B_I \sin(\theta_I + \phi) - Q_{Tx}A_Q B_Q \cos(\theta_Q) + Q_{Rx}B_Q \quad (9)$$

The four Equations (6, 7, 8, and 9) may be solved to determine the transmitter (TX) LO leakage $I_{TX}$ and $Q_{TX}$. For simplicity, substitutions may be performed as follows:

$$x = I_{Tx}$$

$$y = Q_{Tx}$$

$$a = A_I B_I \cos(\theta_I + \phi)$$

$$b = A_Q B_Q \sin(\theta_Q)$$

$$c = A_I B_I \sin(\theta_I + \phi)$$

$$d = A_Q B_Q \cos(\theta_Q)$$

$$p = I_{Rx} B_I$$

$$s = Q_{Rx} B_Q$$

$$y_I = y_{DC-ADC-I}$$

$$y_Q = y_{DC-ADC-Q}$$

With these substitutions, the variables to solve are a, b, c, and d. Therefore, four linear equations may be used to solve for these variables. The overall constant leakage from the ADC is shown in Equation (10):

$$\begin{bmatrix} a & b \\ c & d \end{bmatrix} \begin{bmatrix} I_{Tx} \\ Q_{Tx} \end{bmatrix} + \begin{bmatrix} p & 0 \\ 0 & s \end{bmatrix} \begin{bmatrix} I_{Rx} \\ Q_{Rx} \end{bmatrix} = \begin{bmatrix} y_I \\ y_Q \end{bmatrix} \quad (10)$$

$I_{Tx}$ and $Q_{Tx}$ are the I and Q chain signals in the transmitter, respectively. $I_{Rx}$ and $Q_{Rx}$ are the I and Q chain signals received by the auxiliary receiver 134, respectively. For simplicity, more substitutions may be performed:

$$A = \begin{bmatrix} a & b \\ c & d \end{bmatrix}$$

$$B = \begin{bmatrix} p & 0 \\ 0 & s \end{bmatrix}$$

$$T = \frac{I_{Tx}}{Q_{Tx}}$$

$$R = \frac{I_{Rx}}{Q_{Rx}}$$

$$Y = \frac{y_I}{y_Q}$$

In this solution, two insertions of constant leakage for each chain are used, which are given by $I_{Tx-1}$, $I_{Tx-2}$, $Q_{TX-1}$, and $Q_{Tx-2}$. Signals $I_{Tx-1}$, $I_{TX-2}$, $Q_{Tx-1}$, and $Q_{Tx-2}$ are transmitted, and some LO leakage occurs. These insertions are shown in Equations (11) and (12):

$$T_1 = \frac{I_{Tx} + I_{Tx-1}}{Q_{Tx} + Q_{Tx-1}} \quad (11)$$

$$T_2 = \frac{I_{Tx} + I_{Tx-2}}{Q_{Tx} + Q_{Tx-2}} \quad (12)$$

After these signals are transmitted, the three captures $S_1$, $S_2$, and $S_3$ are determined. Equations (13), (14), and (15) show the three captures. Y, Y1, and Y2 are the resulting signals at the output:

$$S_1 \rightarrow AT + BR = Y \quad (13)$$

$$S_2 \rightarrow A(T+T_1) + BR = Y_1 \quad (14)$$

$$S_3 \rightarrow A(T+T_2) + BR = Y_2 \quad (15)$$

With these captures, $T_1$, $T_2$, Y, $Y_1$, and $Y_2$ are known. $T_1$ and $T_2$ are transmitted signals, and Y, $Y_1$, and $Y_2$ are received signals. Therefore, the rest of the variables in Equations (13), (14), and (15) may be solved for. If S1 is subtracted from S2, and S1 is also subtracted from S3, BR and T may be removed. These subtractions eliminate the BR part (which is the constant leakage from the auxiliary receiver 134). These operations are shown in Equations (16) and (17):

$$S_2 - S_1 \rightarrow AT_1 = Y_1 - Y \quad (16)$$

$$S_3 - S_1 \rightarrow AT_2 = Y_2 - Y \quad (17)$$

The matrices above may be rewritten as Equations (18) and (19):

$$Y_1 - Y = \frac{y_1}{y_2} \quad (18)$$

$$Y_2 - Y = \frac{y_3}{y_4} \quad (19)$$

The only remaining unknown variable is A, which may be estimated by rewriting the matrices for T1 and T2, shown in Equations (11) and (12) above. Equation (20) may be used to estimate A:

$$\begin{bmatrix} I_{Tx-1} & Q_{Tx-1} & 0 & 0 \\ 0 & 0 & I_{Tx-1} & Q_{Tx-1} \\ I_{Tx-2} & Q_{Tx-2} & 0 & 0 \\ 0 & 0 & I_{Tx-2} & Q_{Tx-2} \end{bmatrix} \begin{bmatrix} a \\ b \\ c \\ d \end{bmatrix} = \begin{bmatrix} y_1 \\ y_2 \\ y_3 \\ y_4 \end{bmatrix} \quad (20)$$

The transmit features are represented by A, and Equation (20) provides this estimate so the transmit features may be removed, such as the TX LO leakage. However, the auxiliary receiver 134 components still remain. The auxiliary receiver 134 components (e.g., constant leakage and other impairments) may be removed by switching the switch network 404 as described above and providing a non-inverted signal and an inverted signal. From Equation (20), A is known, and then T (the constant leakage represented by $I_{Tx}$ and $Q_{Tx}$) may be estimated using Equations (21) and (22):

$$AT+BR=Y_1 \qquad (21)$$

$$-AT+BR=Y_2 \qquad (22)$$

Equation (21) represents the non-inverting path (Y1), and Equation (22) represents the inverting path (Y2). By subtracting these two equations, T can be determined, as shown below in Equations (23) and (24):

$$AT = \frac{1}{2}(Y_1 - Y_2) \qquad (23)$$

$$T = \frac{1}{2}A^{-1}(Y_1 - Y_2) \qquad (24)$$

Therefore, two processes are performed to estimate leakage measurement T and provide a correction signal to the transmitter. The first process is to estimate A, which requires the three captures $S_1$, $S_2$, and $S_3$. The second process is estimating T, which uses one more capture. After T is estimated with the loopback path, a negative T may be produced in the transmit path to correct for T. In the examples herein, four signals provide the information for estimating and correcting T (the non-inverted I signal, the inverted I signal, the non-inverted Q signal, and the inverted Q signal). The circuitry and hardware described herein produce these four signals, and the method performs the calculations to estimate and correct the TX LO leakage and other impairments.

The process for estimating and correcting constant leakage described with Equations (1) through (24) is merely one example, and other examples may also be useful. This process may be performed with software or firmware by a controller, such as controller 136.

Figure 5:
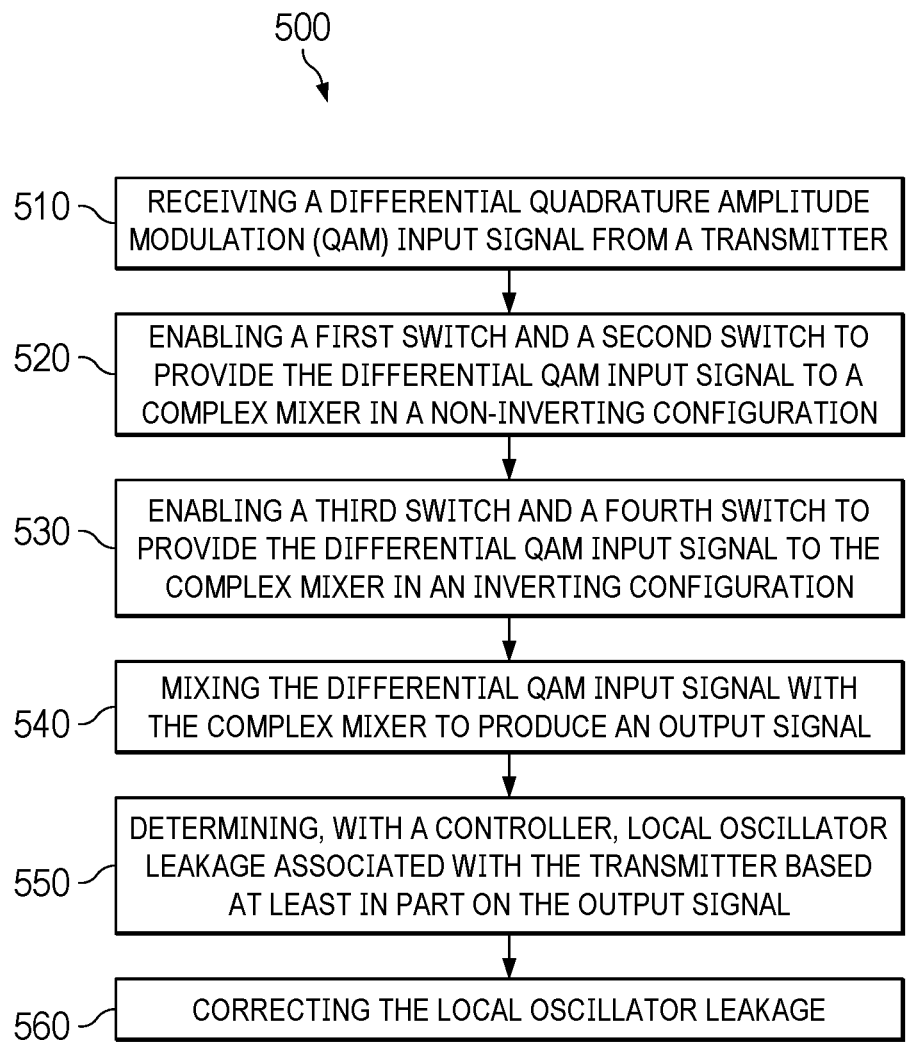
FIG. 5 is a flow diagram of a method for estimating and correcting a transmitter LO leakage in accordance with various examples.

FIG. 5 is a flow diagram of a method 500 for estimating and correcting a transmitter local oscillator leakage in accordance with various examples herein. The steps of method 500 may be performed in any suitable order. The hardware components described above with respect to FIGS. 1-4 may perform method 500 in some examples. Any suitable hardware, software, or digital logic may perform method 500 in some examples.

Method 500 begins at 510, where an auxiliary receiver 134 receives a differential QAM input signal from a transmitter. The input signal may include an I chain signal and a Q chain signal. The auxiliary receiver 134 may include hardware, such as a mixer, that is duplicated so the auxiliary receiver 134 may process both the I chain signal and the Q chain signal as described herein.

Method 500 continues at 520, where a controller, such as controller 136, enables a first switch 312 and a second switch 314 to provide the differential QAM input signal to a complex mixer 138 in a non-inverting configuration. The switches may be transistors in one example. In other examples, a different number of switches may be useful.

Method 500 continues at 530, where a controller, such as controller 136, enables a third switch 316 and a fourth switch 318 to provide the differential QAM input signal to the complex mixer 138 in an inverting configuration. The switches may be transistors in one example. In other examples, a different number of switches may be useful.

Method 500 continues at 540, where the complex mixer 138 mixes the differential QAM input signal as provided in blocks 520 and 530 to produce an output signal. The complex mixer may use transistors that switch at a frequency of a carrier frequency to mix the differential QAM input signal in one example.

Method 500 continues at 550, where the controller 136 estimates or determines a local oscillator leakage associated with the transmitter based at least in part on the differential output signal. In one example, the controller receives an inverted differential output signal and a non-inverted differential output signal. The controller also receives both the inverted and the non-inverted differential output signal from the I chain and from the Q chain. With these four signals (non-inverted in-phase, inverted in-phase, non-inverter quadrature, inverted quadrature), the controller 136 may estimate the local oscillator leakage from the transmitter, and may also correct some impairments of the auxiliary receiver 134.

Method 500 continues at 560, where the controller 136 corrects the local oscillator leakage. In an example, the controller 136 creates a correction signal that is the inverse of the LO leakage. The correction signal may be produced in the transmitter based on the estimation. In one example, the correction signal may be an offset within the data provided to DACs 108 and 110 by LO correction block 166, where the offset corrects the LO leakage.

In examples herein, a loopback path is implemented to measure and then correct transmitter LO leakage using an auxiliary receiver. The examples herein also account for other transmitter impairments, such as IQ mismatch (IQMM), phase noise, radio frequency (RF) non-linearities, etc. In the loopback path, hardware switches compensate for the impairments in the auxiliary receiver path with two configurations. In the first configuration, the transmitted signal plus a signal added by the auxiliary path (e.g., leakage) are provided to the complex mixer in a non-inverting configuration. In the second configuration, the switches are switched, and the transmitted signal minus the signal added by the auxiliary path are provided to the complex mixer in an inverting configuration. A controller analyzes the outputs of the complex mixer for both the non-inverting and the inverting configuration, and then removes the constant signal added by the auxiliary path. This process is performed by the controller for both the I chain and the Q chain. In the examples herein, the time for performing this process is small compared to other systems. The raw IQMM or LO leakage of the loopback path may be high as long as it is the same for both configurations (non-inverting and inverting), which relaxes the analog design requirements for the system. Also, the solution is applicable for all QAM-based architectures.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A system, comprising:
   a receiver configured to receive a differential input signal from a quadrature amplitude modulation (QAM) transmitter at a differential interface that includes a first input and a second input;
   a first switch coupled to the first input and a second switch coupled to the second input, wherein the first switch and second switch are configured to couple the first input and the second input to a complex mixer in a non-inverting configuration;
   a third switch coupled to the first input and a fourth switch coupled to the second input, wherein the third switch and the fourth switch are configured to couple the first input and the second input to the complex mixer in an inverting configuration; and
   wherein the complex mixer is configured to produce an output signal based on the non-inverting configuration and the inverting configuration.

2. The system of claim 1, wherein the differential input signal includes an in-phase (I) chain signal.

3. The system of claim 2, wherein the differential input signal includes a quadrature (Q) chain signal.

4. The system of claim 3, wherein the output signal is produced for both the I chain and the Q chain.

5. The system of claim 4, further comprising:
   a controller configured to correct a transmitter local oscillator leakage with an inverting signal and a non-inverting signal for both the I chain and the Q chain.

6. The system of claim 5, wherein the controller is further configured to correct a leakage associated with the receiver.

7. The system of claim 1, further comprising:
   a first resistor coupled to the first input, the first switch, and the second switch; and
   a second resistor coupled to the second input, the third switch, and the fourth switch.

8. A method, comprising:
   receiving a differential quadrature amplitude modulation (QAM) input signal from a transmitter;
   enabling a first switch and a second switch to provide the differential QAM input signal to a complex mixer in a non-inverting configuration;
   enabling a third switch and a fourth switch to provide the differential QAM input signal to the complex mixer in an inverting configuration;
   mixing the differential QAM input signal with the complex mixer to produce an output signal;
   determining, with a controller, local oscillator leakage associated with the transmitter based at least in part on the output signal; and
   correcting the local oscillator leakage.

9. The method of claim 8, wherein the complex mixer includes a first input and a second input.

10. The method of claim 8, wherein the differential QAM input signal includes an in-phase (I) chain signal.

11. The method of claim 10, wherein the differential QAM input signal includes a quadrature (Q) chain signal.

12. The method of claim 11, further comprising producing the output signal for both the I chain and the Q chain.

13. The method of claim 12, further comprising correcting the local oscillator leakage with an inverting signal and a non-inverting signal for both the I chain and the Q chain.

14. The method of claim 8, wherein receiving the differential QAM input signal from a transmitter includes receiving the differential QAM input signal at an auxiliary receiver coupled to the transmitter.

15. The method of claim 8, further comprising providing an inverting output signal and a non-inverting output signal with the complex mixer.

16. The method of claim 15, further comprising removing receiver impairments based at least in part on the inverting output signal and the non-inverting output signal.

17. The method of claim 8, further comprising providing a correction signal to the transmitter to correct the local oscillator leakage.

18. A system, comprising:
   a transmitter configured to transmit quadrature amplitude modulation (QAM) signals;
   a receiver configured to receive a differential QAM input signal from the transmitter at a differential interface that includes a first input and a second input;
   a first switch coupled to the first input and a second switch coupled to the second input, wherein the first switch and second switch are configured to couple the first input and the second input to a complex mixer in a non-inverting configuration to produce a non-inverting signal provided to the complex mixer;
   a third switch coupled to the first input and a fourth switch coupled to the second input, wherein the third switch and the fourth switch are configured to couple the first input and the second input to the complex mixer in an inverting configuration to produce an inverting signal input to the complex mixer; and a controller configured to correct a transmitter local oscillator leakage with the inverting signal and the non-inverting signal.

19. The system of claim 18, wherein the complex mixer is configured to produce a differential output signal for an I chain of the QAM signals.

20. The system of claim 18, wherein the controller is further configured to provide a correction signal to the transmitter to correct the transmitter local oscillator leakage.

* * * * *